United States Patent
Son et al.

(10) Patent No.: US 7,517,703 B2
(45) Date of Patent: Apr. 14, 2009

(54) METHOD FOR FORMING FERROELECTRIC MEMORY DEVICE

(75) Inventors: Yoon-Ho Son, Yongin-si (KR); Sang-Don Nam, Seoul (KR); Suk-Hun Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/812,141

(22) Filed: Jun. 15, 2007

(65) Prior Publication Data

US 2007/0243641 A1 Oct. 18, 2007

Related U.S. Application Data

(62) Division of application No. 11/196,287, filed on Aug. 4, 2005, now abandoned.

(30) Foreign Application Priority Data

Aug. 6, 2004 (KR) ................................ 2004-62166

(51) Int. Cl.
*H01L 21/00* (2006.01)
(52) U.S. Cl. .......................................... 438/3; 438/238
(58) Field of Classification Search .................... 438/3, 438/238, 381; 257/295
See application file for complete search history.

(56) References Cited

U.S. PATENT DOCUMENTS

| 6,153,460 | A | 11/2000 | Onishi et al. | |
|---|---|---|---|---|
| 6,339,008 | B1 | 1/2002 | Takenaka et al. | |
| 6,699,725 | B2 | 3/2004 | Lee | |
| 6,717,198 | B2 * | 4/2004 | Yoshikawa et al. | 257/295 |
| 6,764,862 | B2 | 7/2004 | Park et al. | |
| 6,888,189 | B2 | 5/2005 | Matsushita et al. | |
| 7,045,839 | B2 * | 5/2006 | Song et al. | 257/295 |
| 2006/0027848 | A1 * | 2/2006 | Son et al. | 257/295 |

FOREIGN PATENT DOCUMENTS

| JP | 08-222711 | 8/1996 |
|---|---|---|
| JP | 2000-13849 | 5/2000 |
| JP | 2002-151657 | 5/2002 |
| KR | 10-2002-0097479 | 12/2002 |
| KR | 10-2004-0001869 | 1/2004 |
| KR | 10-2004-0008638 A | 1/2004 |

* cited by examiner

*Primary Examiner*—Mark Prenty
(74) *Attorney, Agent, or Firm*—Lee & Morse, P.C.

(57) ABSTRACT

A ferroelectric memory device and a method of forming the same are provided. At least two lower electrode patterns are formed on an interlayer insulating layer covering a semiconductor substrate. A seed layer pattern filling a space between at least the two lower electrode patterns and having a planar surface is formed. A ferroelectric layer is formed on the lower electrode pattern and the seed layer pattern. An upper electrode overlapping the two lower electrode patterns is formed on the ferroelectric layer.

9 Claims, 5 Drawing Sheets

METHOD FOR FORMING FERROELECTRIC MEMORY DEVICE

CROSS REFERENCE TO RELATED APPLICATION(S)

This is a divisional application based on application Ser. No. 11/196,287, filed Aug. 4, 2005, now abandoned, the entire contents of which is hereby incorporated by reference.

BACKGROUND OF THE INVENTION

1. Field of the Invention

The present invention relates to a ferroelectric memory device and a method of forming the same.

2. Description of the Related Art

A ferroelectric substance is typically a substance exhibiting a spontaneous electric dipole, which may be reoriented by an applied external electric field. The orientation, or polarization, may remain to some degree even after the external electric field is removed. In addition, spontaneous polarization directions may be affected by changes of the external electric field. Representative ferroelectric substances include PZT: $Pb(Zr,Ti)O_3$ (lead zirconate titanate), SBT: $SrBi_2Ta_2O_9$, etc. In order to form a ferroelectric substance, it is advantageous if the substance, e.g., PZT or SBT, has a crystal structure known as a perovskite structure. In general, this structure may be obtained by forming a ferroelectric layer, heating the layer in an oxidizing ambient at a high temperature, e.g., 700° C., and then crystallizing the layer.

When a ferroelectric layer is etched, e.g., in a process for forming a ferroelectric memory device, the ferroelectric layer may be etch-damaged. This etch-damage may decrease a capacitance of the ferroelectric layer by inducing a pyrochlore phase when the ferroelectric layer is crystallized. This etch-damage may have a significant effect on the reliability of a ferroelectric memory device. Accordingly, in order to avoid or overcome the problem of etch-damage, device structures in which ferroelectric layers are not etched have typically been required. In device structures in which ferroelectric layers are not etched, the ferroelectric layer is typically formed to cover a lower electrode pattern and an interlayer insulating layer and then crystallized. However, when crystallization is performed on a ferroelectric layer formed on an interlayer insulating layer formed of, e.g., silicon oxide, lifting or a cracking may occur and a pyrochlore phase may be generated due to a reaction of the silicon oxide layer with the ferroelectric layer. In addition, if a ferroelectric layer is formed on a curved or non-planar lower structure, crystallization of the ferroelectric layer may not occur smoothly, thereby degrading the reliability of the resulting ferroelectric memory device.

SUMMARY OF THE INVENTION

The present invention is therefore directed to a ferroelectric memory device and method of forming the same, which substantially overcome one or more of the problems due to the limitations and disadvantages of the related art.

It is therefore a feature of an embodiment of the present invention to provide a ferroelectric memory device having a seed barrier pattern to improve crystallization of a ferroelectric layer.

It is therefore another feature of an embodiment of the present invention to provide a method of forming a ferroelectric memory device including forming a seed barrier layer and forming a planar surface for formation of a ferroelectric layer.

At least one of the above features and advantages of the present invention may be realized by providing a ferroelectric memory device including an interlayer insulating layer on a semiconductor substrate, two lower electrodes on the interlayer insulating layer, a seed layer pattern in a space between the two lower electrodes, wherein a surface that includes the seed layer pattern and the two electrodes is planar, a ferroelectric layer on the planar surface, and an upper electrode on the ferroelectric layer and overlapping the two lower electrodes.

The seed layer pattern may include titanium oxide. The device may also include a hydrogen barrier pattern interposed between the lower electrode and the seed layer pattern, and between the seed layer pattern and the interlayer insulating layer. The hydrogen barrier pattern may include at least one material selected from a group consisting of aluminum oxide, silicon oxide, titanium oxide, zirconium oxide, and cesium oxide. The interlayer insulating layer may include silicon oxide and the ferroelectric layer may include at least one material selected from a group consisting of $Pb(Zr,Ti)O_3$, $PbTiO_3$, $PbLaTiO_3$, $(Ba,Sr)TiO_3$, $BaTiO_3$, $Ba_4Ti_3O_{12}$, $SrBi_2TaO_9$, $SrTiO_3$, $SrBi_2Ta_2O_9$, $SrBi_2(Ta,Nb)_2O_9$, and $SrBi_3Ti_2TaO_{12}$. The lower electrode and the upper electrode may include at least one material selected from a group consisting of ruthenium, iridium, platinum, ruthenium oxide, iridium oxide, and platinum oxide.

The device may include a second hydrogen barrier layer on the upper electrode and on portions of the ferroelectric layer adjacent to the upper electrode. The device may also include a lower electrode contact penetrating the interlayer insulating layer to electrically connect the lower electrode with the semiconductor substrate, and a diffusion barrier layer interposed between the lower electrode and the interlayer insulating layer, and between the lower electrode and the lower electrode contact.

At least one of the above and other features and advantages of the present invention may also be realized by providing a method for forming a ferroelectric memory device, including forming two lower electrode patterns on an interlayer insulating layer covering a semiconductor substrate, forming a seed layer pattern in a space between the two lower electrode patterns, wherein a surface that includes the seed layer pattern and the two lower electrode patterns is planar, forming a ferroelectric layer on the planar surface, and forming an upper electrode pattern on the ferroelectric layer, the upper electrode overlapping the two lower electrode patterns.

The ferroelectric layer may cover the lower electrode patterns and the seed layer pattern. Forming the seed layer pattern may include forming a seed layer on the semiconductor substrate having the two lower electrode patterns, the seed layer filling a space between the two lower electrode patterns, and removing a part of the seed layer by performing a planarization process, to expose the two lower electrode patterns and to leave a seed layer pattern between the two lower electrode patterns. The planarization process may include a chemical mechanical polishing process performed using a pressure for pressing a wafer in a range from about 1 to 5 psi, a pressure for fixing a wafer in a range from about 1 to 5 psig, a speed for rotating a table on which the wafer is placed in a range from about 30 to 50 rpm, and a speed for rotating a head for chucking a wafer in a range from about 10 to 30 rpm.

The method may also include conformally forming a hydrogen barrier layer before forming the seed layer, and removing a part of the hydrogen barrier layer by performing the planarization process, to form a hydrogen barrier pattern interposed between the lower electrode and the seed layer pattern and between the seed layer pattern and the interlayer insulating layer. The hydrogen barrier layer may include at least one material selected from a group consisting of aluminum oxide, silicon oxide, titanium oxide, zirconium oxide, and cesium oxide, the seed layer pattern may include titanium oxide, and the ferroelectric layer may include at least one material selected from a group consisting of $Pb(Zr,Ti)O_3$, $PbTiO_3$, $PbLaTiO_3$, $(Ba,Sr)TiO_3$, $BaTiO_3$, $Ba_4Ti_3O_{12}$, $SrBi_2TaO_9$, $SrTiO_3$, $SrBi_2Ta_2O_9$, $SrBi_2(Ta,Nb)_2O_9$, and $SrBi_3Ti_2TaO_{12}$. The method may also include forming a second hydrogen barrier layer covering the upper electrode and portions of the ferroelectric layer adjacent to the upper electrode.

At least one of the above and other features and advantages of the present invention may further be realized by providing a semiconductor device, including a first electrode, two second electrodes, a titanium oxide pattern, wherein the titanium oxide pattern is between the two second electrodes, and a ferroelectric element disposed adjacent to the titanium oxide pattern and the two second electrodes, and between the first electrode and the two second electrodes, wherein the portion of the ferroelectric element that is adjacent to the titanium oxide pattern and the two second electrodes is planar. The ferroelectric element may be directly adjacent to the titanium oxide pattern and the two second electrodes. The device may further include a pair of transistors, wherein the pair of transistors has a first common diffusion region and two separate second diffusion regions, and wherein each of the second electrodes is connected to a respective one of the two separate second diffusion regions.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
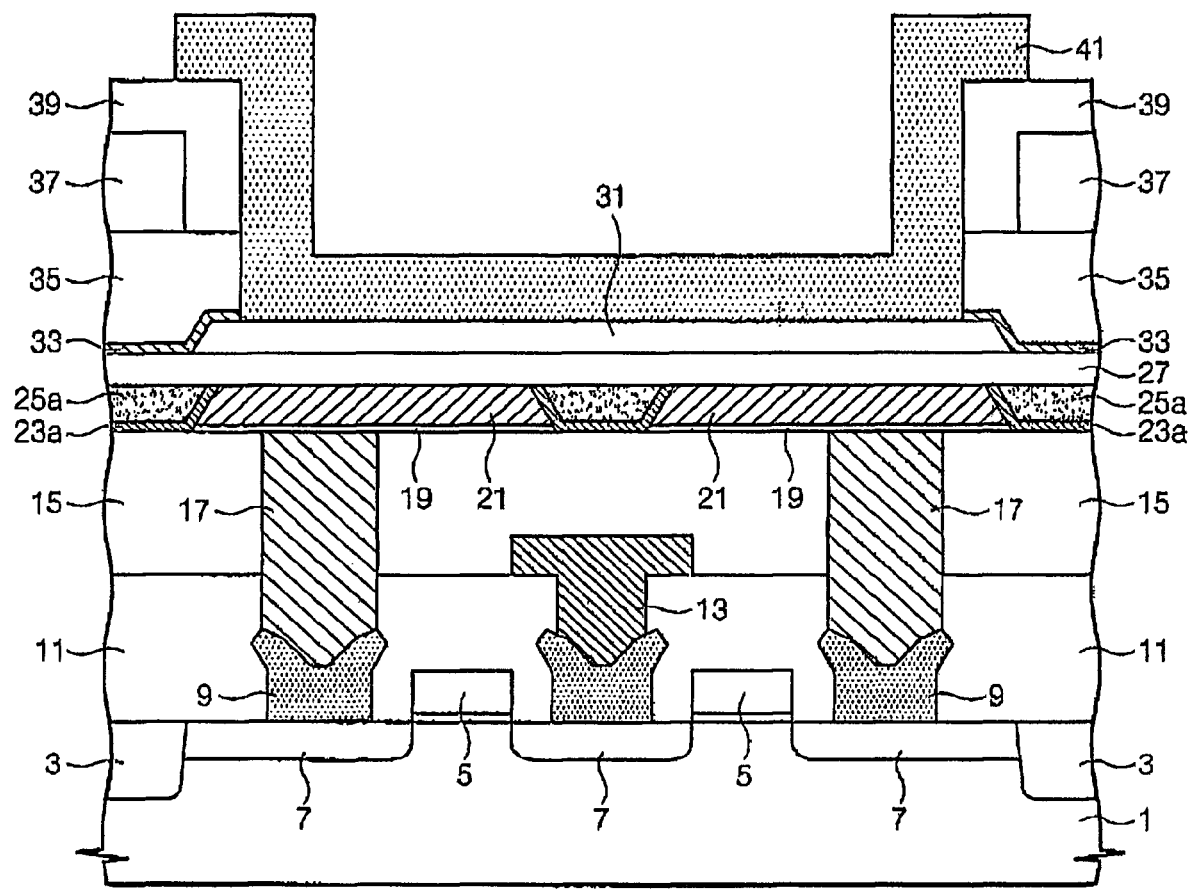
FIG. 1 illustrates a cross-sectional view of a ferroelectric memory device in accordance with an embodiment of the present invention.

Korean Patent Application No. 2004-62166, filed on Aug. 6, 2004, in the Korean Intellectual Property Office, and entitled: "FERROELECTRIC MEMORY DEVICE AND METHOD THEREOF," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional view of a ferroelectric memory device in accordance with an embodiment of the present invention. Referring to FIG. 1, a device isolation layer 3 may be formed on a semiconductor substrate 1 to define an active region. A plurality of gate patterns 5 having a gate oxide layer and a gate electrode may be formed in the active region of the semiconductor substrate 1. An impurity doped region 7 may be formed in the semiconductor substrate 1 at both sides of the plurality of gate patterns 5. A contact pad 9 may be formed at each impurity doped region 7 and may include polysilicon. A first interlayer insulating layer 11 may cover the semiconductor substrate 1 having the contact pad 9. A bit line contact 13 may penetrate the first interlayer insulating layer 11 to connect to the contact pad 9. The bit line contact 13 may include a conductive material, e.g., tungsten (W). A second interlayer insulating layer 15 may be formed to cover the bit line contact 13, and a lower electrode contact 17 may penetrate the second interlayer insulating layer 15 and the first interlayer insulating layer 11 to connect to the contact pad. The lower electrode contact 17 may include a conductive material, e.g., tungsten. The first and the second interlayer insulating layers 11 and 15 may include an insulating material such as silicon oxide.

A continuous diffusion barrier layer 19 may be formed to cover the lower electrode contact 17 and a part of the second interlayer insulating layer 15. The diffusion barrier layer 19 may include, e.g., titanium nitride (TiN), titanium aluminum nitride (TiAlN), tantalum nitride (TaN), and/or tantalum aluminum nitride (TaAlN). The diffusion barrier layer 19 may help prevent the lower electrode contact 17 from being damaged, thus protecting it. In addition, the diffusion barrier layer 19 may improve adhesion between a subsequently-formed lower electrode (e.g., a lower electrode 21) and the second interlayer insulating layer 15. The lower electrode 21 may be formed on the diffusion barrier layer 19. The lower electrode 21 may include, e.g., ruthenium (Ru), iridium (Ir), platinum (Pt), ruthenium oxide ($RuO_x$), iridium oxide ($IrO_x$), and/or platinum oxide ($PtO_x$).

A hydrogen barrier pattern 23a may be formed from a hydrogen barrier layer and may be interposed between the lower electrode and the seed layer pattern, and between the seed layer pattern and the interlayer insulating layer, covering the lower electrode 21, including sidewalls, diffusion barrier layer 19 and the second interlayer insulating layer 15. The hydrogen barrier pattern 23a may include, e.g., aluminum oxide ($Al_2O_3$), silicon oxide ($SiO_2$), titanium oxide ($TiO_2$), zirconium oxide ($ZrO_2$), and/or cesium oxide ($CeO_2$). The hydrogen barrier pattern 23a may help prevent the lower electrode contact 17 from being oxidized or transformed, e.g., due to diffusion of hydrogen and oxygen through the second interlayer insulating layer 15.

A seed layer pattern 25a may be formed on the hydrogen barrier pattern 23a. The seed layer pattern 25a may include, e.g., titanium oxide. The seed layer pattern 25a may help prevent a pyrochlore phase from being formed by a reaction of a ferroelectric layer 27 with an oxide layer of the second interlayer insulating layer during a subsequent thermal process for crystallization of the ferroelectric layer 27. In addition, the seed layer pattern 25a may function as a seed layer when a thermal process is performed for crystallizing the ferroelectric layer 27. The lower electrode 21, the hydrogen barrier pattern 23a and the seed layer pattern 25a may have a planar aspect, i.e., flat top surfaces and the same heights.

The ferroelectric layer 27 may be formed on the top surfaces of the lower electrode 21, the hydrogen barrier pattern 23a and the seed layer pattern 25a. The ferroelectric layer 27 may include, e.g., PZT, $PbTiO_3$, $PbLaTiO_3$, BST: (Ba,Sr)$TiO_3$, $BaTiO_3$, $Ba_4Ti_3O_{12}$, $SrBi_2TaO_9$, $SrTiO_3$, SBT, SBTN: $SrBi_2(Ta,Nb)_2O_9$, and/or SBTT: $SrBi_3Ti_2TaO_{12}$. As the structure underlying the ferroelectric layer 27 may be flat, the bottom and the top surfaces of the ferroelectric layer 27 may also be flat. Therefore, a subsequent thermal crystallization process of the ferroelectric layer 27 may proceed more smoothly.

An upper electrode 31 may be formed on the ferroelectric layer 27. The upper electrode 31 may be formed to overlap at least two lower electrodes 21. The upper electrode 31 may include, e.g., ruthenium, iridium, platinum, ruthenium oxide, iridium oxide, and/or platinum oxide. A hydrogen barrier layer 33 may be formed to cover the upper electrode 31 and portions of the ferroelectric layer 27 extending laterally from sides of the upper electrode 31. The hydrogen barrier layer 33 may include, e.g., aluminum oxide, silicon oxide, titanium oxide, zirconium oxide, and/or cesium oxide. The hydrogen barrier layer 33 may help prevent the ferroelectric layer 27 from being damaged, e.g., due to diffusion of hydrogen and oxygen.

A first inter-metal insulating layer 35 may be formed to cover the hydrogen barrier layer 33. An interconnection 37 may be formed on the first inter-metal insulating layer 35 and may include a conductive material, e.g., aluminum. A second inter-metal insulating layer 39 may be formed to cover the interconnection 37. A wide via plug 41 may penetrate the second inter-metal insulating layer 39, the first inter-metal insulating layer 35 and the hydrogen barrier layer 33 to electrically connect with the upper electrode 31. The wide via plug 41 may include a conductive material.

Figure 2:
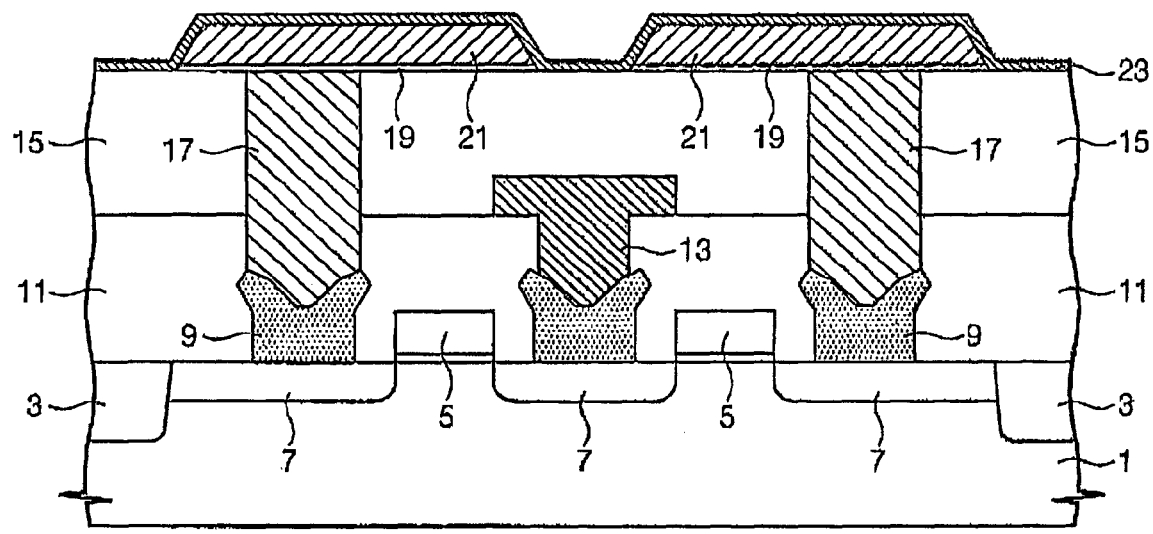
FIGS. 2 to 7 illustrate cross-sectional views of stages in a method for forming a ferroelectric memory device in accordance with an embodiment of the present invention.

FIGS. 2 to 7 illustrate cross-sectional views of stages in a method for forming a ferroelectric memory device in accordance with an embodiment of the present invention. Referring to FIG. 2, a device isolation layer 3 may be formed on a semiconductor substrate 1 and define an active region. The device isolation layer 3 may be formed by, e.g., a shallow trench isolation method. A gate pattern 5 having, e.g., a gate oxide layer and a gate electrode, may be formed at the active region. The gate electrode may be formed, e.g., polysilicon, tungsten, copper (Cu), aluminum (Al), tungsten nitride, and/or tungsten silicide. An impurity-doped region 7 may be formed at the active region alongside the gate pattern 5. A pad contact 9 may be electrically connected to the impurity-doped region 7. The pad contact 9 may be formed by, e.g., a self-aligned contact method, and may include, e.g., polysilicon, etc. A first interlayer insulating layer 11 may be formed to cover the pad contact 9, the gate pattern 5, the impurity region 7 and the device isolation layer 3. The first interlayer insulating layer 11 may include, e.g., silicon oxide. A bit line contact 13 may penetrate the first interlayer insulating layer 11 to electrically connect to the pad contact 9. The bit line contact 13 may include a conductive material, e.g., tungsten. A second interlayer insulating layer 15 may be formed to cover the bit line contact 13 and the first interlayer insulating layer 11. The second interlayer insulating layer 15 may include, e.g., silicon oxide. The second interlayer insulating layer 15 and the first interlayer insulating layer 11 may be patterned to form a contact hole. A lower electrode contact 17 may be formed to electrically connect with the pad contact 9. The lower electrode contact 17 may include a conductive material, e.g., tungsten. A planarization process may be performed after the contact hole is filled with the conductive material. A diffusion barrier layer 19 and a lower electrode layer 21 may be sequentially stacked on the planarized structure. The diffusion barrier layer 19 may include, e.g., titanium nitride, titanium aluminum nitride, tantalum nitride, and/or tantalum aluminum nitride. The lower electrode layer 21 may include, e.g. ruthenium, iridium, platinum, ruthenium oxide, iridium oxide, and/or platinum oxide. The lower electrode layer 21 and the diffusion barrier layer 19 may be sequentially patterned to expose the second interlayer insulating layer 15 and to complete the lower electrode 21 at the same time. A first hydrogen barrier layer 23 may be conformally formed on the resultant structure. The first hydrogen barrier layer 23 may include, e.g., aluminum oxide, silicon oxide, titanium oxide, zirconium oxide, and/or cesium oxide.

Figure 3:
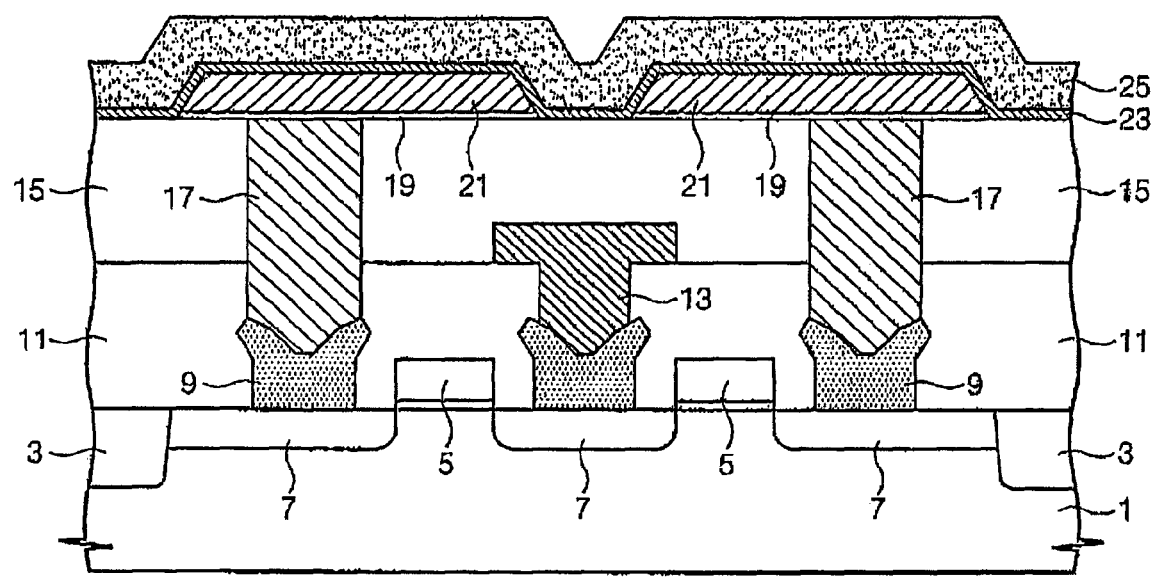

Referring to FIG. 3, a seed layer 25 may be stacked on the first hydrogen barrier layer 23 and may include, e.g., titanium oxide. The seed layer 25 may be formed to have a thickness great enough to fill a space between the lower electrodes 21 and may be formed by various methods including, e.g., sputtering, atomic layer deposition, chemical mechanical deposition, etc.

Figure 4:
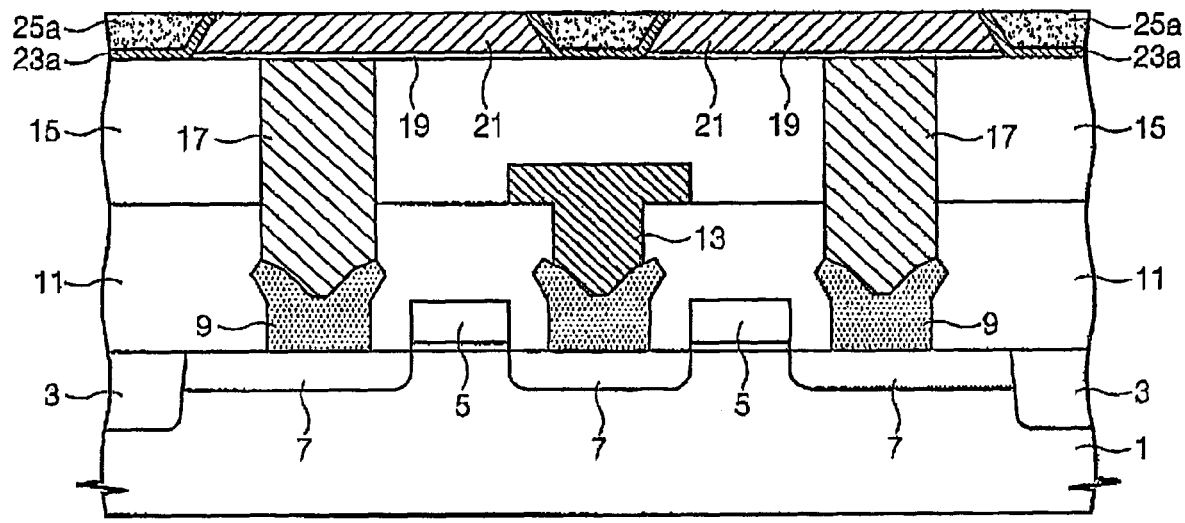

Referring to FIG. 4, a planarization process may be performed with respect to the seed layer 25 and the first hydrogen barrier layer 23 to expose the top surface of the lower electrode 21 and to form the hydrogen barrier pattern 23a and the seed layer pattern 25a between the lower electrodes 21 at the same time. The planarization process may be a chemical mechanical polishing process, and the chemical mechanical polishing process may be performed wherein a pressure for pressing a wafer ranges between about 1 and 5 psi, a pressure for fixing a wafer ranges from about 1 to 5 psig, a speed for rotating a table on which the wafer is placed ranges from about 30 to 50 rpm, and a speed for rotating a head for chucking a wafer ranges from about 10 to 30 rpm.

Figure 5:
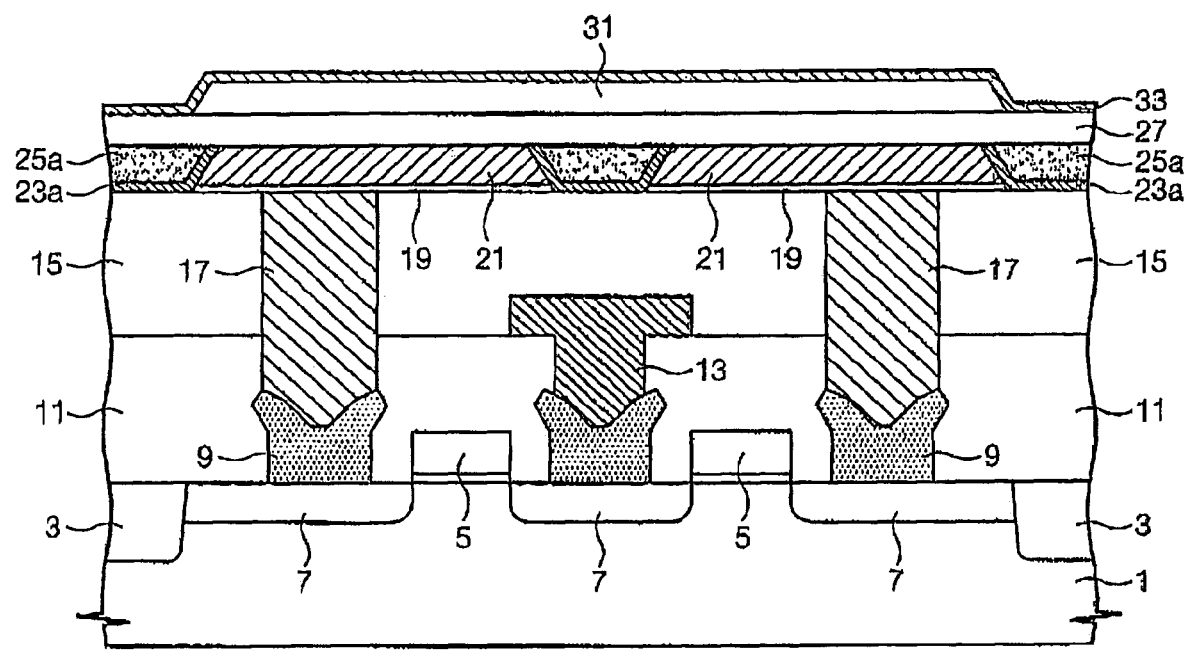

Referring to FIG. 5, a ferroelectric layer 27 may be formed on the resulting planarized structure. The ferroelectric layer 27 may be formed using a sol-gel method or MOCVD (metal organic chemical vapor deposition) method. If the ferroelectric layer 27 is formed by the MOCVD method, the ferroelectric layer 27 may exhibit improved polarization and improve capacitance. Further, as the ferroelectric layer 27 may be formed on a planarized surface, a uniform deposition on the surface may be obtained. The ferroelectric layer 27 may include, e.g., PZT, $PbTiO_3$, $PbLaTiO_3$, BST, $BaTiO_3$, $Ba_4Ti_3O_{12}$, $SrBi_2TaO_9$, $SrTiO_3$, SBT, SBTN, and/or SBTT. The ferroelectric layer 27 may be crystallized by performing a thermal process.

An upper electrode layer may be formed on the crystallized ferroelectric layer 27 and patterned to form an upper electrode 31. The upper electrode 31 may include, e.g., ruthenium, iridium, platinum, ruthenium oxide, iridium oxide, and/or platinum oxide. In addition, a second hydrogen barrier layer 33 may be formed to cover the upper electrode 31 and the ferroelectric layer 27. The second hydrogen barrier layer 33 may include, e.g., aluminum oxide, silicon oxide, titanium oxide, zirconium oxide, and/or cesium oxide.

Figure 6:
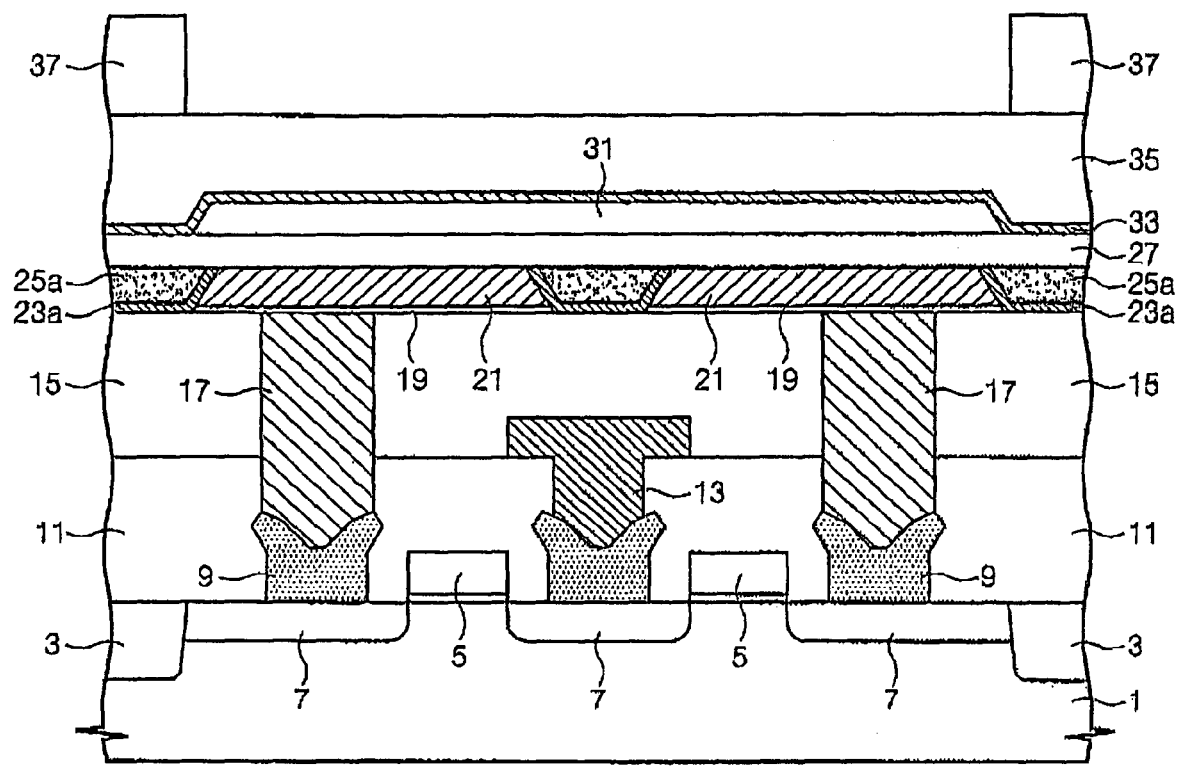

Referring to FIG. 6, a first inter-metal insulating layer 35 may be formed on the second hydrogen barrier layer 33. The first inter-metal insulating layer 35 may include, e.g., silicon oxide. A conductive layer may be formed on the first inter-metal insulating layer 35 and patterned to form an interconnection 37. The interconnection 37 may include a metal, e.g., aluminum.

Figure 7:
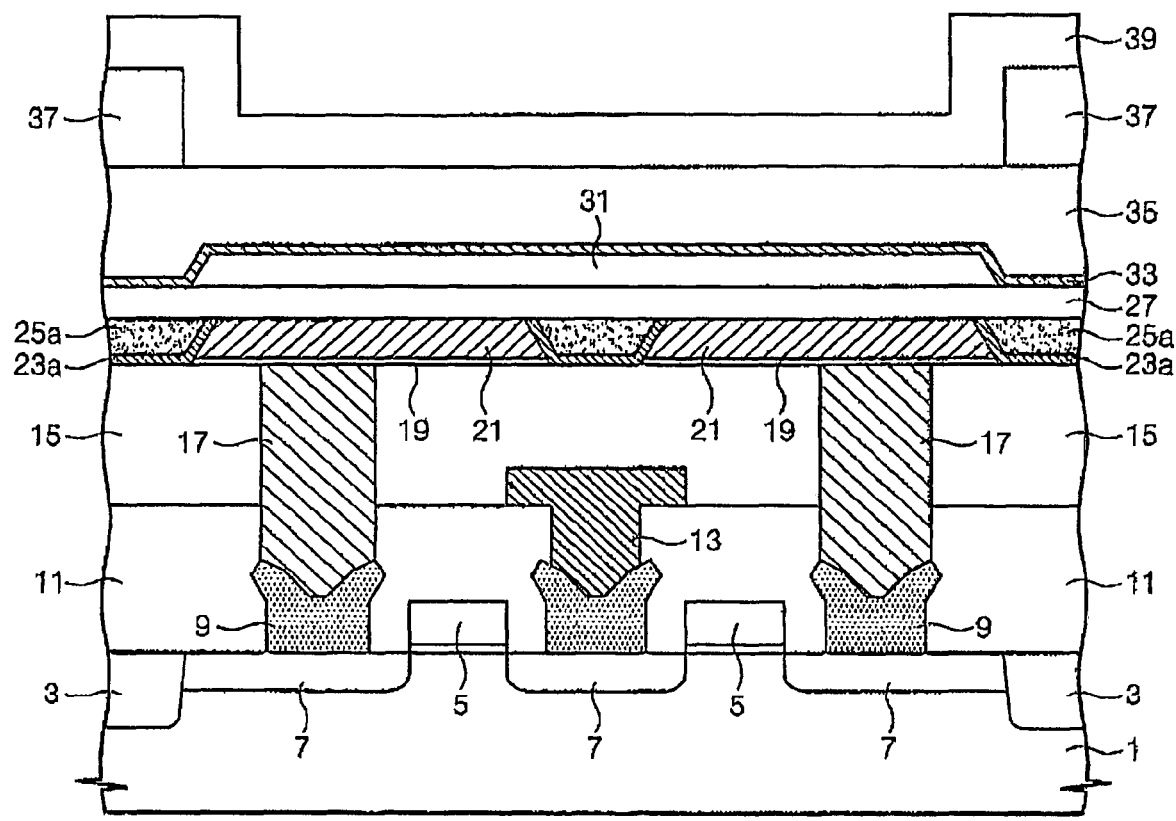

Referring to FIG. 7, a second inter-metal insulating layer 39 may be formed to cover the interconnection 37 and the first inter-metal insulating layer 35. The second inter-metal insulating layer 39 may be, e.g., a silicon oxide layer. Subsequently, referring to FIG. 1, the second inter-metal insulating layer 39, the first inter-metal insulating layer 35 and the second hydrogen barrier layer 33 may be patterned to form a wide via hole exposing the upper electrode 31. A conductive layer may be formed and patterned to form a wide via plug electrically connected to upper electrode 31. Subsequently, a ball, e.g., a solder ball, may be connected to the wide via plug.

In accordance with the ferroelectric memory device and the method of forming the same of the present invention, a seed layer pattern may fill a space between a plurality of lower electrodes, and a top surface of the seed layer pattern adjacent to the lower electrode may be flat. Therefore, a ferroelectric layer may be formed on a flat lower structure, and the crystallization of the ferroelectric layer may be more easily performed. In addition, as a ferroelectric layer and an interlayer insulating layer may be isolated from each other by a seed layer pattern, the lifting, cracking and/or pyrochlore phase formation of the conventional methods may be avoided. Therefore, a ferroelectric layer exhibiting improved crystallization may be formed, resulting in a more reliable ferroelectric memory device.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for forming a ferroelectric memory device, comprising:
   forming two lower electrode patterns on an interlayer insulating layer covering a semiconductor substrate;
   forming a seed layer pattern to fill up a space defined between the two lower electrode patterns, wherein a surface that includes the seed layer pattern and the two lower electrode patterns is planar;
   forming a ferroelectric layer on the planar surface; and
   forming an upper electrode pattern on the ferroelectric layer, the upper electrode overlapping the two lower electrode patterns wherein:
   forming the seed layer pattern includes:
      forming a seed layer on the semiconductor substrate having the two lower electrode patterns, the seed layer filling the space defined between the two lower electrode patterns; and
      removing a part of the seed layer by performing a planarization process, to expose the two lower electrode patterns and to leave the seed layer pattern for filling up the space defined between the two lower electrode patterns, and
   the planarization process includes:
      a chemical mechanical polishing process performed using a pressure for pressing a wafer in a range from about 1 to 5 psi, a pressure for fixing the wafer in a range from about 1 to 5 psi, a speed for rotating a table on which the wafer is placed in a range from about 30 to 50 rpm, and a speed for rotating a head for chucking the wafer in a range from about 10 to 30 rpm.

2. The method as claimed in claim 1, wherein the ferroelectric layer covers the lower electrode patterns and the seed layer pattern.

3. A method for forming a ferroelectric memory device, comprising:
   forming two lower electrode patterns on an interlayer insulating layer covering a semiconductor substrate;
   forming a seed layer pattern to fill up a space defined between the two lower electrode patterns, wherein a surface that includes the seed layer pattern and the two lower electrode patterns is planar;
   forming a ferroelectric layer on the planar surface; and
   forming an upper electrode pattern on the ferroelectric layer, the upper electrode overlapping the two lower electrode patterns, wherein forming the seed layer pattern includes:
      forming a seed layer on the semiconductor substrate having the two lower electrode patterns, the seed layer filling the space defined between the two lower electrode patterns; and
      removing a part of the seed layer by performing a planarization process, to expose the two lower electrode patterns and to leave the seed layer pattern for filling up the space defined between the two lower electrode patterns,
   the method further comprising:
   conformally forming a first hydrogen barrier layer before forming the seed layer; and
   removing a part of the first hydrogen barrier layer by performing the planarization process, to form a first hydrogen barrier pattern interposed between each lower electrode and the seed layer pattern and between the seed layer pattern and the interlayer insulating layer, the first hydrogen barrier pattern including a lateral extension directly on the interlayer insulating layer and in contact with the seed layer pattern.

4. The method as claimed in claim 3, wherein the first hydrogen barrier layer includes at least one material selected from a group consisting of aluminum oxide, silicon oxide, titanium oxide, zirconium oxide, and cesium oxide.

5. The method as claimed in claim 1, wherein the seed layer pattern includes titanium oxide.

6. The method as claimed in claim 1, wherein the ferroelectric layer includes at least one material selected from a group consisting of $Pb(Zr,Ti)O_3$, $PbTiO_3$, $PbLaTiO_3$, $(Ba,Sr)TiO_3$, $BaTiO_3$, $Ba_4Ti_3O_{12}$, $SrBi_2TaO_9$, $SrTiO_3$, $SrBi_2Ta_2O_9$, $SrBi_2(Ta,Nb)_2O_9$, and $SrBi_3Ti_2TaO_{12}$.

7. The method as claimed in claim 1, further comprising forming a hydrogen barrier layer covering the upper electrode and portions of the ferroelectric layer adjacent to the upper electrode.

8. A method for forming a ferroelectric memory device, comprising:
   forming two lower electrode contacts in an interlayer insulating layer;
   forming a diffusion barrier layer on the two lower electrode contacts and on the interlayer insulating layer;
   forming two lower electrode patterns on the interlayer insulating layer, such that the two lower electrode patterns are isolated from the interlayer insulating layer by the diffusion barrier layer;
   forming a seed layer pattern to fill up a space defined between the two lower electrode patterns, wherein a surface that includes the seed layer pattern and the two lower electrode patterns is planar;
   forming a ferroelectric layer on the planar surface; and
   forming an upper electrode pattern on the ferroelectric layer, the upper electrode overlapping the two lower electrode patterns, wherein:
   the diffusion barrier layer is a nitride layer,
   the diffusion barrier layer includes one or more of titanium nitride, titanium aluminum nitride, tantalum nitride, and/or tantalum aluminum nitride, forming the seed layer pattern includes:
forming a seed layer on the semiconductor substrate having the two lower electrode patterns, the seed layer filling the space defined between the two lower electrode patterns; and
removing a part of the seed layer by performing a planarization process, to expose the two lower electrode patterns and to leave the seed layer pattern for filling up the space defined between the two lower electrode patterns, and
the planarization process includes:
a chemical mechanical polishing process performed using a pressure for pressing a wafer in a range from about 1 to 5 psi, a pressure for fixing the wafer in a range from about 1 to 5 psi, a speed for rotating a table on which the wafer is placed in a range from about 30 to 50 rpm, and a speed for rotating a head for chucking the wafer in a range from about 10 to 30 rpm.

9. A method for forming a ferroelectric memory device, comprising:
forming two lower electrode contacts in an interlayer insulating layer;
forming a diffusion barrier layer on the two lower electrode contacts and on the interlayer insulating layer;
forming two lower electrode patterns on the interlayer insulating layer, such that the two lower electrode patterns are isolated from the interlayer insulating layer by the diffusion barrier layer;
forming a seed layer pattern to fill up a space defined between the two lower electrode Patterns, wherein a surface that includes the seed layer pattern and the two lower electrode patterns is planar;
forming a ferroelectric layer on the planar surface; and
forming an upper electrode pattern on the ferroelectric layer, the upper electrode overlapping the two lower electrode patterns, wherein:
the diffusion barrier layer is a nitride layer, and
the diffusion barrier layer includes one or more of titanium nitride, titanium aluminum nitride, tantalum nitride, and/or tantalum aluminum nitride, the method further comprising:
conformally forming a first hydrogen barrier layer before forming the seed layer pattern; and
removing a part of the first hydrogen barrier layer by performing a planarization process to form a first hydrogen barrier pattern interposed between each lower electrode and the seed layer pattern and between the seed layer pattern and the interlayer insulating layer, the first hydrogen barrier pattern including a lateral extension directly on the interlayer insulating layer and in contact with the seed layer pattern.

* * * * *